(12) United States Patent
Suzuki et al.

(10) Patent No.: US 10,043,836 B2
(45) Date of Patent: Aug. 7, 2018

(54) DISPLAY DEVICE

(71) Applicant: Japan Display Inc., Tokyo (JP)

(72) Inventors: Yuji Suzuki, Tokyo (JP); Hiroshi Mizuhashi, Tokyo (JP); Hayato Kurasawa, Tokyo (JP); Daichi Suzuki, Tokyo (JP)

(73) Assignee: Japan Display Inc., Tokyo (JP)

( * ) Notice: Subject to any disclaimer, the term of this patent is extended or adjusted under 35 U.S.C. 154(b) by 63 days.

(21) Appl. No.: 15/223,767

(22) Filed: Jul. 29, 2016

(65) Prior Publication Data

US 2017/0179168 A1    Jun. 22, 2017

(30) Foreign Application Priority Data

Dec. 18, 2015  (JP) ................. 2015-247419

(51) Int. Cl.

| G02F 1/1335 | (2006.01) |
| H01L 27/13 | (2006.01) |
| H01L 27/32 | (2006.01) |
| H01Q 1/24 | (2006.01) |
| H01Q 1/36 | (2006.01) |
| H01L 51/52 | (2006.01) |
| H01Q 1/44 | (2006.01) |
| H01Q 7/00 | (2006.01) |

(52) U.S. Cl.
CPC ........ *H01L 27/13* (2013.01); *G02F 1/133553* (2013.01); *H01L 27/3225* (2013.01); *H01L 51/5218* (2013.01); *H01Q 1/24* (2013.01); *H01Q 1/36* (2013.01); *G02F 2201/123* (2013.01); *G02F 2203/02* (2013.01); *H01L 27/3248* (2013.01); *H01Q 1/44* (2013.01); *H01Q 7/00* (2013.01)

(58) Field of Classification Search
None
See application file for complete search history.

(56) References Cited

U.S. PATENT DOCUMENTS

| 2004/0189625 | A1* | 9/2004 | Sato ................. G06K 19/07749 345/204 |
| 2006/0033874 | A1* | 2/2006 | Sakama ................... G02F 1/13 349/152 |
| 2007/0146309 | A1* | 6/2007 | Uchida .................. G02F 1/167 345/107 |
| 2008/0111760 | A1* | 5/2008 | Sakama ........... G06K 19/07745 343/860 |
| 2009/0262041 | A1* | 10/2009 | Ikemoto ........... G06K 19/07749 343/860 |
| 2010/0078787 | A1* | 4/2010 | Yakubo ............ G06K 19/07749 257/679 |
| 2010/0156735 | A1 | 6/2010 | Nakamura et al. |

(Continued)

FOREIGN PATENT DOCUMENTS

| JP | 2011-205718 A | 10/2011 |
| JP | 2014-021169 A | 2/2014 |

*Primary Examiner* — Ryan Crockett
(74) *Attorney, Agent, or Firm* — K&L Gates LLP

(57) ABSTRACT

According to one embodiment, a display device includes an insulating substrate, display function layer disposed above the insulating substrate, reflective electrode disposed between the insulating substrate and the display function layer, to which a potential for image display is applied, and antenna having a band shape disposed between the insulating substrate and the reflective electrode.

20 Claims, 15 Drawing Sheets

(56) References Cited

U.S. PATENT DOCUMENTS

| | | | |
|---|---|---|---|
| 2011/0248940 A1* | 10/2011 | Chuang | G06F 3/045 345/173 |
| 2014/0015866 A1 | 1/2014 | Teranishi et al. | |
| 2014/0191988 A1* | 7/2014 | Corrion | G06F 3/044 345/173 |
| 2015/0187878 A1* | 7/2015 | Yamazaki | H01L 27/1225 257/43 |
| 2015/0219948 A1* | 8/2015 | Kamimura | G02F 1/13338 349/12 |
| 2015/0355758 A1* | 12/2015 | Zhang | G06F 3/0416 345/174 |
| 2016/0093940 A1* | 3/2016 | Pan | H01Q 1/2258 455/277.1 |
| 2016/0254587 A1* | 9/2016 | Jung | H01Q 1/273 343/702 |
| 2016/0329363 A1* | 11/2016 | He | H01L 21/77 |
| 2017/0047361 A1* | 2/2017 | Xu | H01L 27/13 |
| 2017/0179567 A1* | 6/2017 | Zou | H01Q 1/22 |
| 2017/0249791 A1* | 8/2017 | Woo | G07C 9/00111 |
| 2017/0279499 A1* | 9/2017 | Kadowaki | G06K 7/10297 |
| 2017/0295241 A1* | 10/2017 | Hirukawa | H04L 67/125 |

\* cited by examiner

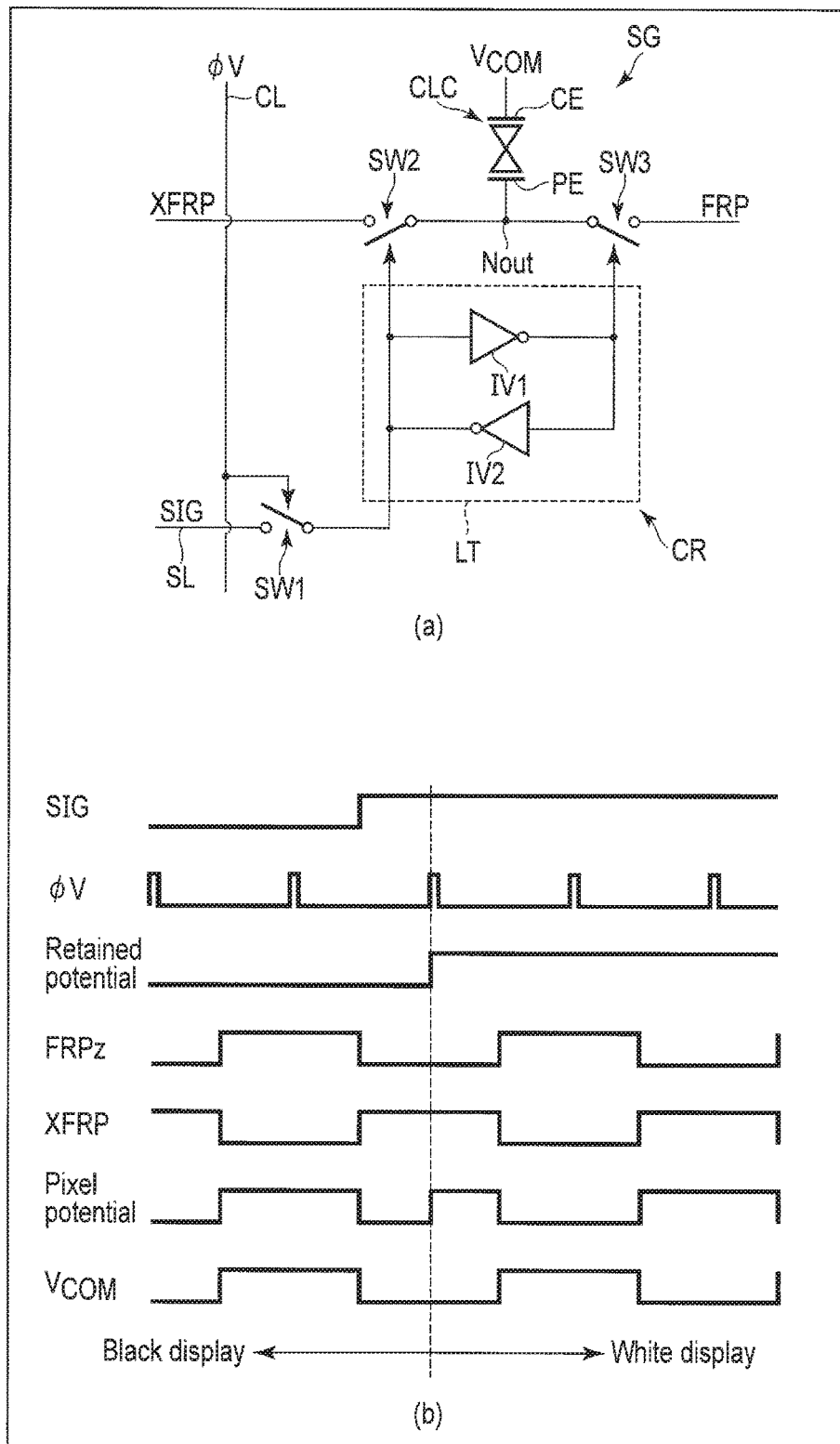
F I G. 3

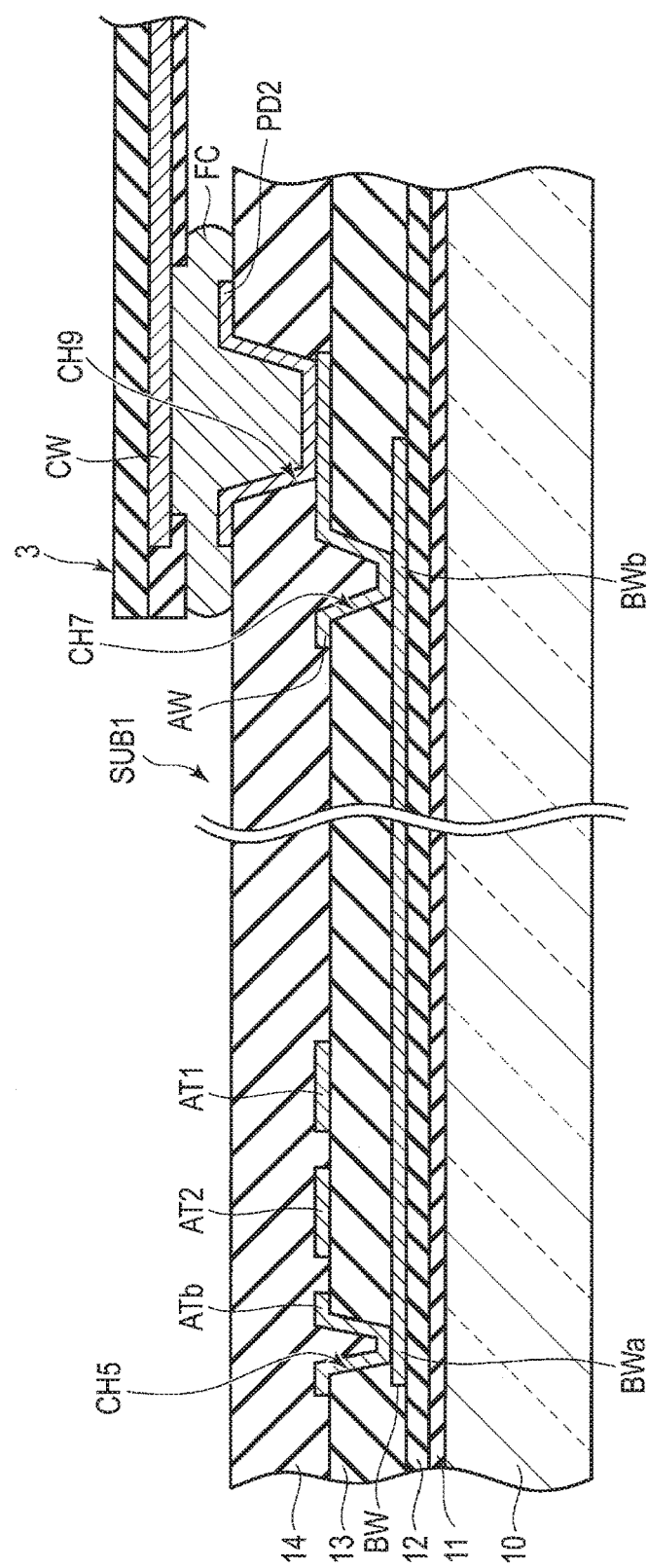
F I G. 9

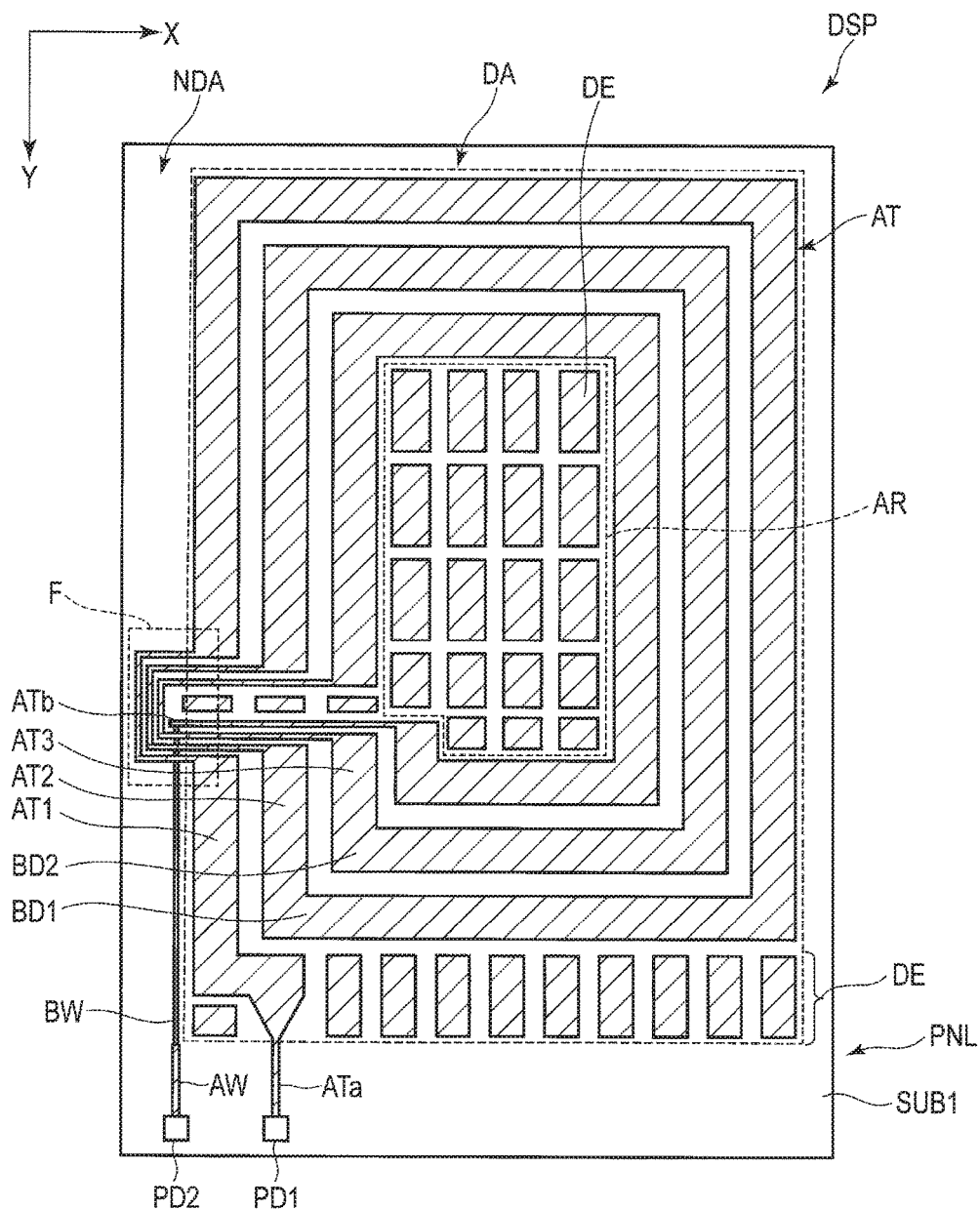
F I G. 10

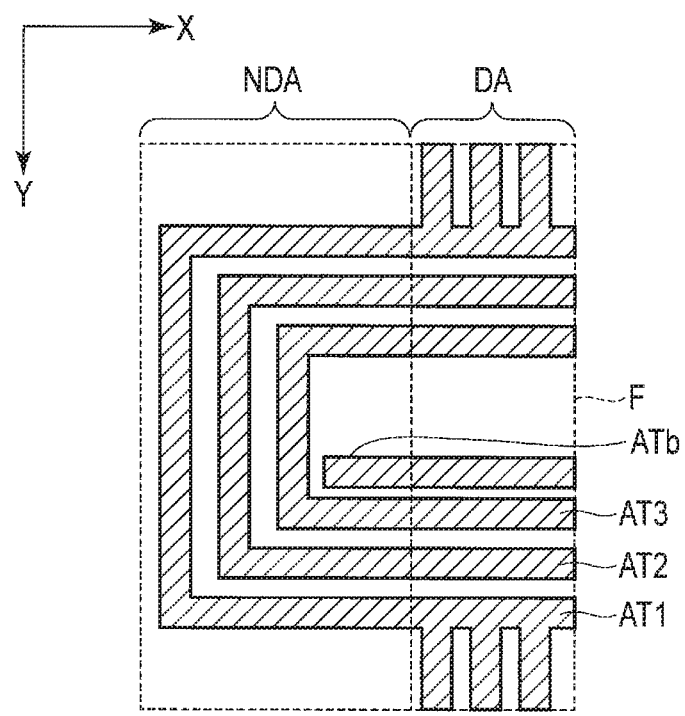
F I G. 11

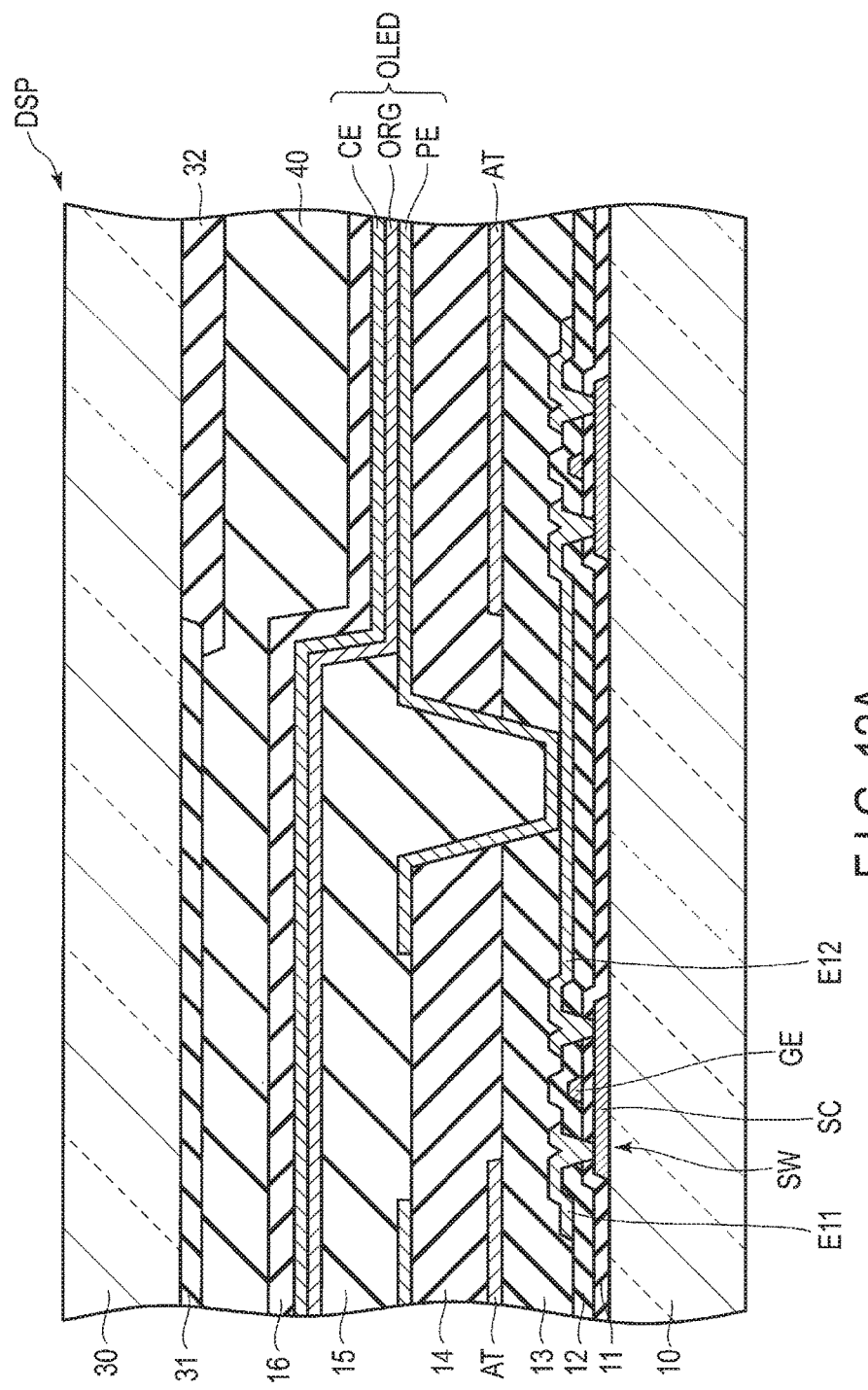
F I G. 12A

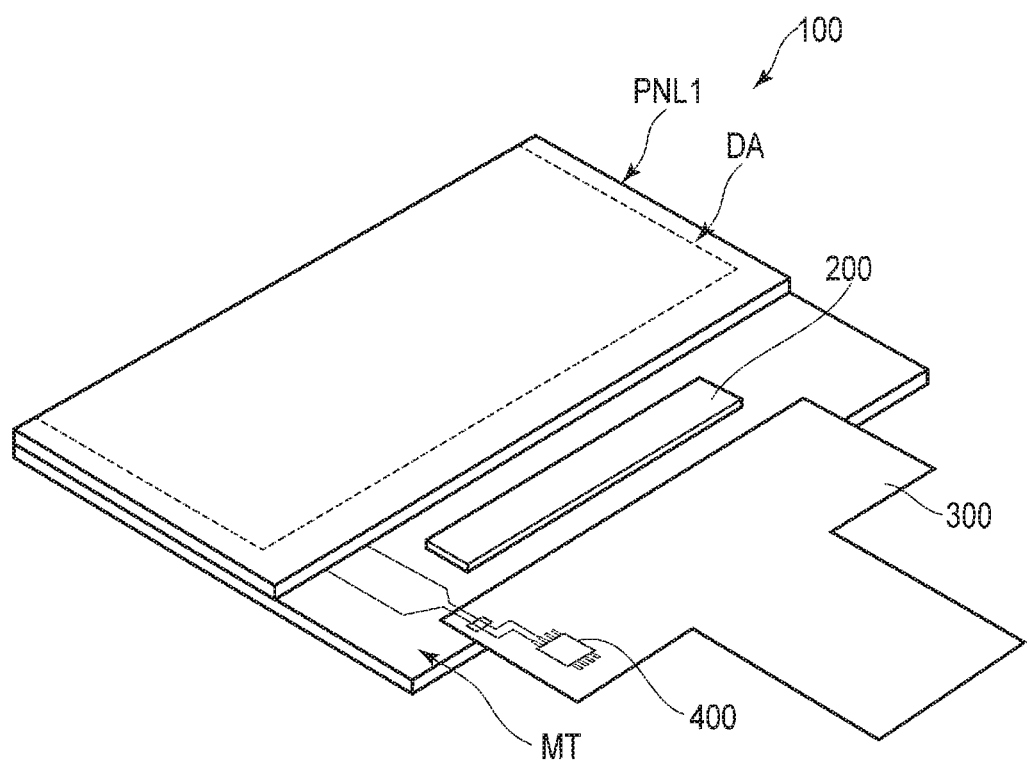
F I G. 13

DISPLAY DEVICE

CROSS-REFERENCE TO RELATED APPLICATIONS

This application is based upon and claims the benefit of priority from Japanese Patent Application No. 2015-247419, filed Dec. 18, 2015, the entire contents of which are incorporated herein by reference.

FIELD

Embodiments described herein relate generally to a display device.

BACKGROUND

In recent years, liquid crystal display devices have come to be used in various technical fields. There is a technique of providing a memory with each pixel of such display devices for a graduated display process.

Furthermore, some display devices include not only a display function but also a close range wireless communication function. As a communication protocol for a close range wireless communication, there is Near Field Communication (NFC). In relation to this, there are, for example, antenna devices configured to transfer/receive data using the NFC protocol which are used in small communication devices such as mobile phones.

SUMMARY

The present application generally relates to a display device.

According to one embodiment, a display device includes an insulating substrate, display function layer disposed above the insulating substrate, reflective electrode disposed between the insulating substrate and the display function layer, to which a potential for image display is applied, and antenna having a band shape disposed between the insulating substrate and the reflective electrode.

Additional features and advantages are described herein, and will be apparent from the following Detailed Description and the figures.

BRIEF DESCRIPTION OF THE DRAWINGS

FIG. 3 shows an example of the structure and operation of a segment SG of a memory-in-pixel (MIP) scheme.

FIG. 9 is a cross-section of the display device DSP of FIG. 5, taken long a bridge line BW.

FIG. 10 shows another example of the arrangement of the antenna AT and the dummy electrode DE in the display device DSP.

FIG. 11 shows area E of the antenna AT of FIG. 10 in detail.

FIG. 12A is a schematic cross-section showing a variation of the display device DSP of an embodiment.

FIG. 13 shows an electronic device 100 in which the display device DSP of the embodiment is applied.

DETAILED DESCRIPTION

Figure 1:
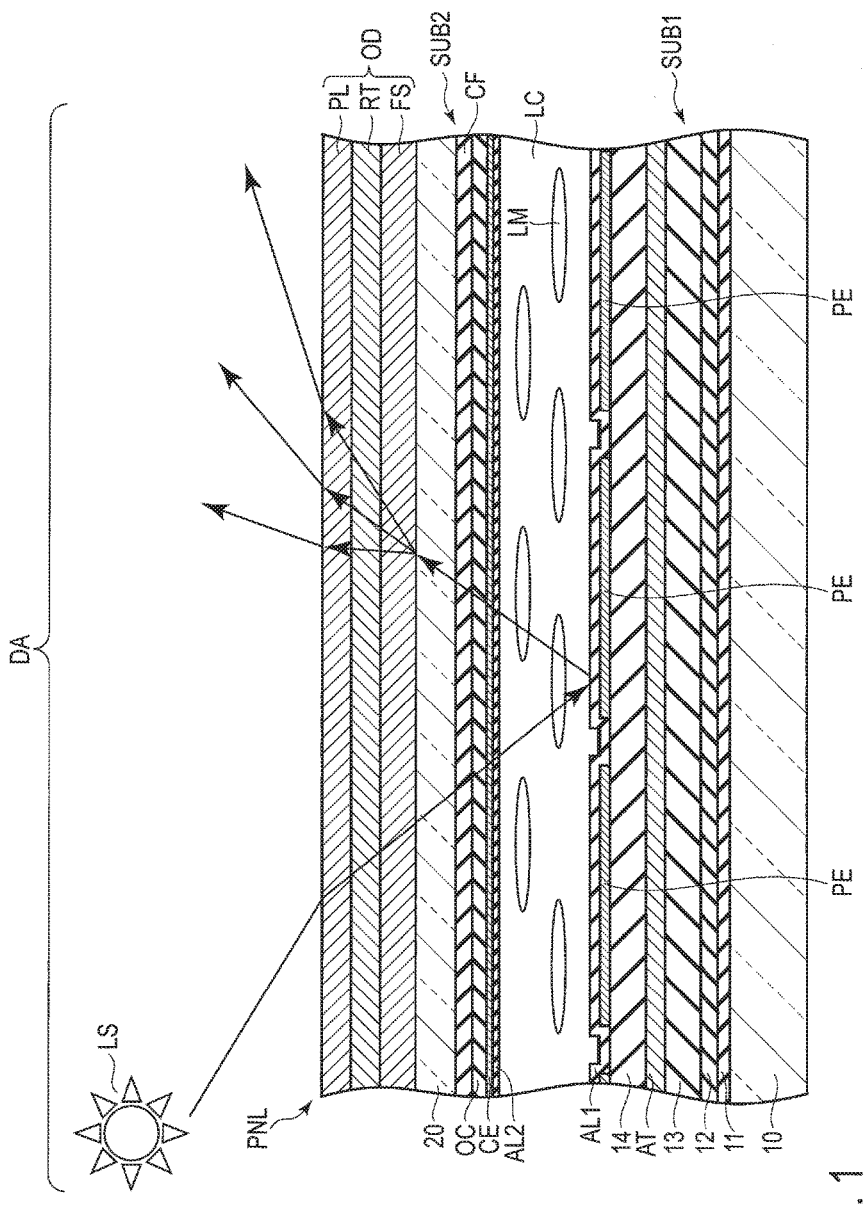
FIG. 1 is a cross-section of a display panel PNL.

In general, according to one embodiment, provided is a display device including an insulating substrate, display function layer disposed above the insulating substrate, reflective electrode which is disposed between the insulating substrate and the display function layer and to which a potential for image display is applied, and a band-like antenna disposed between the insulating substrate and the reflective electrode.

Embodiments will be described hereinafter with reference to the accompanying drawings. Incidentally, the disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc. of the respective parts are schematically illustrated in the drawings, compared to the actual modes. However, the schematic illustration is merely an example, and adds no restrictions to the interpretation of the invention. Besides, in the specification and drawings, the structural elements having functions, which are identical or similar to the functions of the structural elements described in connection with preceding drawings, are denoted by like reference numerals, and an overlapping detailed description is omitted unless necessary.

In the following description, a liquid crystal display device is exemplified as a display device of embodiments. The display device can be used in various devices including, for example, smartphones, tablet computers, feature phones, personal computers, television receivers, in-car entertainment and navigation equipment, portable game consoles, and card displays such as traffic smartcards with a display thereon.

Now, an example of the structure of a reflective display panel PNL will be explained.

FIG. 1 is a cross-section of the display panel PNL in a display area DA used for image display. The display panel PNL depicted is a liquid crystal display panel. In the figure, only the structure necessary for the explanation is depicted.

In the present application, a direction from a first substrate SUB1 to a second substrate SUB2 is referred to as above or upward, and a direction from the second substrate SUB2 to the first substrate SUB1 is referred to as below or downward.

The display panel PNL includes a first substrate SUB1, second substrate SUB2, liquid crystal layer LC, and optical element OD. The liquid crystal layer LC corresponds to a display function layer.

The first substrate SUB1 includes, for example, a first insulating substrate 10, first insulating film 11, second insulating film 12, third insulating film 13, antenna AT, fourth insulating film 14, pixel electrode PE, and first alignment film AL1. The first insulating film 11 is disposed above the first insulating substrate 10. The second insulating film 12 is disposed above the first insulating film 11, and the third insulating film 13 is disposed above the second insulating film 12.

The antenna AT is disposed above the third insulating film 13 and is covered with the fourth insulating film 14. Furthermore, the antenna AT is disposed to be opposed to the display area DA. Pixel electrodes PE are disposed above the fourth insulating film 14. As a layering relationship, the pixel electrodes PE are above the first insulating substrate 10 and the antenna AT is between the first insulating substrate 10 and the pixel electrodes PE. The pixel electrode PE corresponds to a reflective electrode and includes a reflective layer formed of a light reflective metal material such as aluminum or silver. The first alignment film AL1 covers the pixel electrodes PE.

The second substrate SUB2 includes, for example, a second insulating substrate 20, color filter layer CF, overcoat layer OC, common electrode CE, and second alignment film AL2. The color filter layer CF is disposed to be opposed to the first substrate SUB1 of the second insulating substrate 20. The overcoat layer OC covers the color filter layer CF. On the surface of the overcoat layer OC opposed to the first substrate SUB1, a common electrode CE is formed. The common electrode CE is formed as a flat plate having an area at least corresponding to the display area DA, and corresponds to the pixel electrodes PE on the display area DA. Note that the shape of the common electrode CE is not limited to a flat plate uniformly opposed to the pixel electrodes PE, and may be divided into bands or a matrix. If the common electrode CE is divided, slits are formed in the divided common electrode CE, and such slits should be arranged to correspond to pixels (pixels PX described later), specifically, for example, arranged to be opposed to various lines on the first substrate SUB1. The common electrode CE is formed of a transparent conductive material such as indium tin oxide (ITO) or indium zinc oxide (IZO). The second alignment film AL2 covers the common electrode CE.

The liquid crystal layer LC is held between the first substrate SUB1 and the second substrate SUB2 and includes liquid crystal molecules LM between the first alignment film AL1 and the second alignment film AL2.

On the surface of the second substrate SUB2 opposite to the surface contacting the liquid crystal layer LC, the optical element OD is disposed. The optical element OD includes, for example, a diffusion layer FS, phase differential plate RT, and polarization plate PL. The diffusion layer FS is adhered to the second insulating substrate 20, the phase differential plate RT is layered on the diffusion layer FS, and the polarization plate PL is layered on the phase differential plate RT. Note that the structure of the optical element OD is not limited to the example depicted.

The diffusion layer FS is an anisotropic diffusion layer which diffuses incident light from a particular direction. In the example depicted, the diffusion layer FS almost completely passes the incident light from a light source LS without diffusion but diffuses light from a particular direction, that is, reflected light from the pixel electrodes PE. The phase differential plate RT functions as a quarter-wavelength plate. In this example, the phase differential plate RT is a combination of a quarter-wavelength plate and a half-wavelength plate which reduces wavelength dependency and is composed to obtain a desired phase difference within the wavelength range used for color display.

Such a display panel PNL has its display surface at the side where the optical element OD is disposed with respect to the liquid crystal layer LC. In the example depicted, the surface of the optical element OD corresponds to the display surface, and if a cover member is disposed on the surface of the optical element OD, the surface of the cover member corresponds to the display surface.

In the present embodiment, the display panel PNL includes an antenna AT. The antenna AT functions as an NFC antenna applied to the near field communication (NFC). NFC is a close range wireless communication technique which uses 13.56 MHz frequency with a 10-cm communication range.

Note that the antenna AT may correspond to various communication types, and NFC-Type F, NFC-type A, and NFC-type B are applicable as other NFC protocols, for example. As a broader close range wireless communication technique, Radio-Frequency Identification (RFID) using an electromagnetic field, radio wave, or the like is available. RFID is a general term related to the close range wireless communication technique, and any NFC technique standardized according to a particular criterion is included in RFID. In the present embodiment, the antenna AT is applicable to RFID. The types of RFID include, for example, a passive type which does not include a battery and is activated by electromagnetic waves from a reader, an active type which includes a battery and produces electromagnetic waves by itself, and a semiactive type which is a combination of the passive type and the active type. Various antennas used for RFID have same basic transmission/receipt schemes, and in the present application, any type of antenna can be applied to the display device DSP.

In the present embodiment, the display device DSP includes, in the display area DA, the antenna AT disposed between the first insulating substrate 10 and the pixel electrodes PE as the reflective electrodes. The pixel electrodes PE are disposed above the antenna AT (in the display surface side). Therefore, even when the antenna AT is disposed in the display panel PNL, a possible reduction of the area of the openings used for display and a possible exposure of the antenna AT while the display image is being viewed from the display surface side can be prevented. Therefore, a high performance display device having both an image display function and an NFC function can be presented.

Now, an example of the structure of the display device will be explained.

Figure 2:
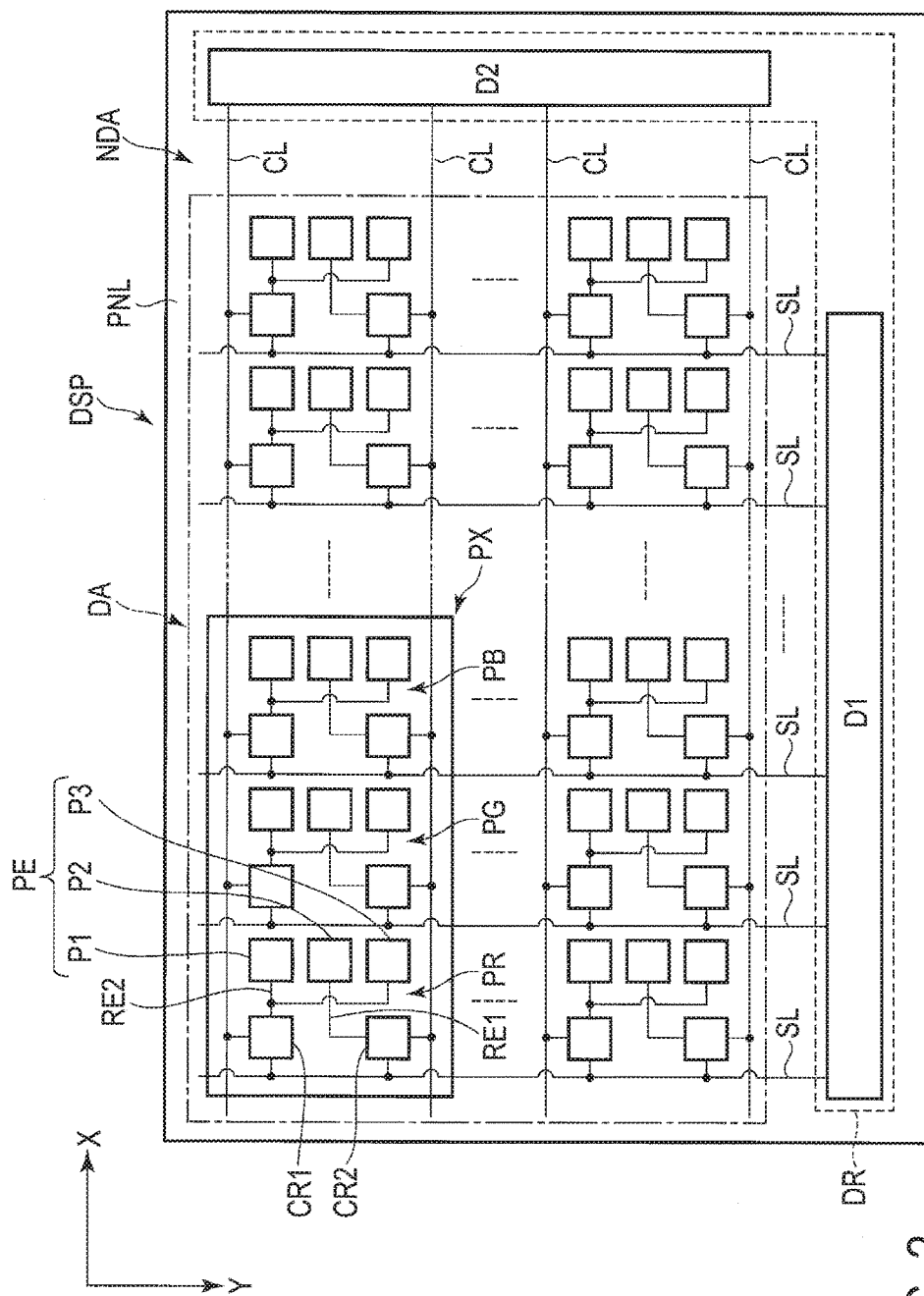
FIG. 2 is a block diagram showing an example of the structure of a display device DSP.

FIG. 2 is a block diagram showing an example of the structure of the display device DSP. In the example depicted, the display device DSP includes, for example, a display panel PNL and a driver DR. Furthermore, as in FIG. 1, the display panel PNL includes the antenna AT for close range wireless communication.

The display panel PNL includes a display area DA for image display and a frame-like non-display area NDA which surrounds the display area DA. Furthermore, the display panel PNL includes signal lines SL, scan lines CL, unit pixels PX, and other lines and power lines used for transference of various voltages which are not depicted. Signal lines SL are arranged in a first direction X. Scan lines CL are arranged in a second direction Y which crosses the first direction X. Unit pixels PX are arranged in a matrix in the X-Y plane which is defined by the first direction X and the second direction Y.

In the present embodiment, the first direction X and the second direction Y are orthogonal; however, they may simply cross each other, and thus, a variation in which the direction X and the direction Y are substantially orthogonal may be adopted. Furthermore, viewing the display panel PNL from the direction orthogonal to the X-Y plane which is defined by the first direction X and the second direction Y (from the direction normal to the X-Y plane) is referred to as a plan view.

A unit pixel PX is a minimum unit of a color image. As described later, a unit pixel PX includes several subpixels. In this example, a single unit pixel PX includes a red subpixel PR, green subpixel PG, and blue subpixel PB. Such a unit pixel PX may include, in addition to the above three subpixels, a white subpixel or the like. Subpixels PR, PG, PB are structured substantially the same, and in this example, the structure thereof will be explained focusing on a subpixel PR.

A subpixel PR includes partial electrodes P1, P2, and P3 functioning as pixel electrodes PE and pixel circuits CR1 and CR2. In this example, partial electrodes P1, P2, and P3 are arranged in a row, having the same area, and formed in a square. Partial electrode P2 is electrically connected to pixel circuit CR1 by relay electrode RE1. Partial electrodes P1 and P3 are electrically connected to each other by relay electrode RE2, and are electrically connected to pixel circuit CR2. That is, partial electrodes P1 and P3 are separated by partial electrode P2 but are electrically connected to each other and they function in combination.

Such a subpixel is composed of several segments SG. In the example depicted, a combination of partial electrode P2, relay electrode RE1, and pixel circuit CR2 corresponds to one segment, and a combination of partial electrodes P1 and P3, relay electrode RE2, and pixel circuit CR1 corresponds to another segment. The structure of the segment SG will be specified later with reference to FIG. 3.

In the present embodiment, a segment SG adopts a memory-in-pixel (MIP) scheme by which a memory is incorporated in a pixel area for data storage. In this scheme, a segment includes a memory which can store binary data (logic 1s and logic 0s). Based on the binary data, a gradation of each subpixel is displayed digitally. As a graduated display scheme using such binary data, an area graduated scheme is used in this embodiment. In the area graduated scheme, a single subpixel is composed of several segments SG and graduated display is achieved by a combination of such segments SG. In the area graduated scheme, for example, the graduation is achieved using $2^n$ gradations by n segments SG area ratios of which are weighed such as $2^0$, $2^1$, $2^2$, . . . , $2^{n-1}$. In the present embodiment, an area of a segment SG corresponds to a total area of partial electrodes in a segment SG.

In a memory display mode, a gradation of each subpixel is displayed using data stored in memory. Thus, there is no necessity of writing a signal potential on which a gradation is reflected in each subpixel in a frame period, and thus, the memory display mode can reduce power used by the display device.

In the example of FIG. 2, a two-bit MIP scheme is adopted. That is, as described above, a single subpixel includes partial electrodes P1, P2, and P3 which have the same area and partial electrodes P1 and P3 are electrically connected together. A ratio of the area of partial electrode P2 to the area of partial electrodes P1 and P3 is 1:2. Thus, a graduated display is achieved in each subpixel. Here, a relay electrode is disposed in a layer between a pixel circuit CR and a pixel electrode PE for electric connection of the pixel circuit CR and the pixel electrode PE.

The driver DR includes signal line driver D1 and a scan line driver D2. Each signal line SL is connected to the signal line driver D1 which, for example, outputs a signal potential corresponding to a particular gradation to its corresponding signal lines SL. Each scan line CL is connected to the scan line driver D2 which outputs a control signal of a write operation of the signal potential to a subpixel to its corresponding scan lines CL. Note that the driver DR may further include a drive timing generator circuit and a power circuit, for example.

FIG. 3 shows an example of the structure and operation of a segment SG of the MIP scheme. FIG. 3(a) shows an example of the structure of the segment SG of FIG. 2. In the example depicted, a single segment SG includes a liquid crystal capacitance CLC and a pixel circuit CR. The liquid crystal capacitance CLC is a capacitance component of the liquid crystal layer produced between the pixel electrode PE and the common electrode CE. Note that, a pixel electrode PE described hereinafter corresponds to a partial electrode electrically connected to a pixel circuit CR as explained with reference to FIG. 2. A common voltage Vcom is applied to the common electrode CE.

A pixel circuit CR includes three switches SW1 to SW3 and a latch LT. Switch SW1 is, for example, composed of an N-channel MOS transistor. Switch SW1 includes one end connected to a signal line SL and the other end connected to the latch LT. Switch SW1 is closed/opened by a scan signal supplied from a scan line CL. That is, switch SW1 is turned on (closed) by a scan signal φV supplied from the scan line driver D2 of FIG. 2 through the scan line CL and takes in data (signal potential corresponding to a gradation) SIG supplied from the signal line driver D1 of FIG. 2 through the signal line SL.

The latch LT includes inverters IV1 and IV2 connected to be opposite to each other in parallel. Each of the inverters IV1 and IV2 is, for example, a CMOS inverter. The latch LT retains (latches) a potential corresponding to the data SIG taken by the switch SW1.

Each of switches SW2 and SW3 is, for example, a transfer switch in which an N-channel MOS transistor and a P-channel MOS transistor are connected in parallel. Note that other transistors can be used therein. To one end of switch SW2, a voltage XFRP which is reverse phase to the common voltage Vcom. To one end of switch SW3, a voltage FRP which is in phase with the common voltage Vcom. The other ends of switches SW2 and SW3 are connected together and are electrically connected to the pixel electrode PE to function as an output node Nout of the pixel circuit CR. Either switch SW2 or switch SW3 is turned on depending on the polarity of the potential retained by the latch LT. Thereby, the in-phase voltage FRP or the reverse phase voltage XFRP is applied to the pixel electrode PE in the liquid crystal capacitance CLC in which the common voltage Vcom is applied to the common electrode CE.

FIG. 3(b) is a timing chart of the operation of a segment SG of MIP scheme. In the following explanation, a normally black mode in which black is displayed when a voltage is not applied to the liquid crystal layer LC is adopted.

In the pixel circuit CR, the data SIG supplied to the signal line SL are taken in when a control signal φV is given to switch SW1, and a potential corresponding to the data SIG taken therein is retained by the latch LT. If the data SIG taken in corresponds to logic 0, the potential retained by the latch LT becomes negative. At that time, switch SW2 is turned off (opened) and switch SW3 is turned on (closed), and the voltage FRP which is in phase with the common voltage Vcom is applied to the pixel electrode PE. Thereby, the potential of the pixel electrode PE becomes equal to the common voltage Vcom of the common electrode, and no voltage is applied to the liquid crystal layer LC causing the segment SG to display black.

On the other hand, if the data SIG taken in corresponds to logic 1, the potential retained by the latch LT become positive. At that time, switch SW3 is turned off (opened) and switch SW2 is turned on (closed), and the voltage XFRP which is reverse phase to the common voltage Vcom is applied to the pixel electrode PE. Thereby, a potential difference occurs between the potential of the pixel electrode PE and the common voltage Vcom of the common electrode. That is, a voltage is applied to the liquid crystal layer LC, and light passing through the liquid crystal layer LC is modulated and partly contributes to the display causing the segment SG to display white.

As can be understood from the above, in the structure to which the MIP scheme is applied, either switch SW2 or switch SW3 is turned on depending on the polarity of the potential retained by the latch LT, and thus, either the in-phase voltage FRP or the reverse-phase voltage XFRP is applied to the pixel electrode PE. Since a certain voltage is constantly applied to the segment SG, shading can be suppressed.

In the above example, a memory disposed in a segment SG is a static random access memory (SRAM); however, no limitation is intended thereby. The memory may be a dynamic random access memory (DRAM) or the like.

Figure 4:
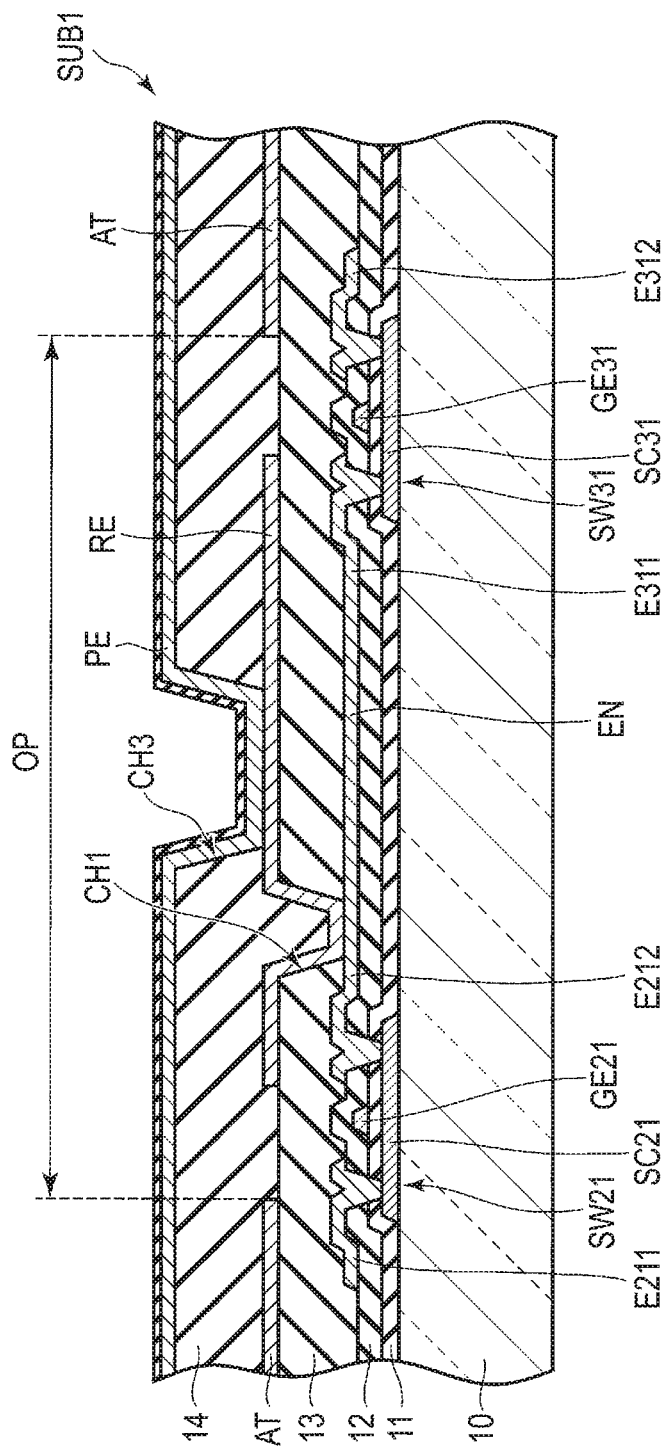
FIG. 4 is a cross-section of a first substrate SUB1 of the display panel PNL of FIG. 1.

FIG. 4 is a cross-section of the first substrate SUB1 of the display panel PNL of FIG. 1. The first substrate SUB1 further includes, for example, switches SW21 and SW31 and a relay electrode RE on the first insulating substrate 10. Here, switch SW21 corresponds to switch SW2 of FIG. 3(a), and switch SW31 corresponds to switch SW3 of FIG. 3(a).

Switch SW21 includes a semiconductor layer SC21, gate electrode GE21, and a first electrode E211 and a second electrode E212 corresponding to a source and a drain. Switch SW31 includes a semiconductor layer SC31, gate electrode GE31, and third electrode E311 and fourth electrode E312 corresponding to a source and a drain.

Semiconductor layers SC21 and SC31 are disposed on the first insulating substrate 10 and are covered with the first insulating film 11. Gate electrodes GE21 and GE31 are disposed on the first insulating film 11 and are covered with the second insulating film 12. The first electrode E211 and the second electrode E212, and the third electrode E311 and the fourth electrode E312 are disposed on the second insulating film 12 and are covered with the third insulating film 13. The first electrode E211 and the second electrode E212 contact semiconductor layer SC21, and the third electrode E311 and the fourth electrode E312 contact semiconductor layer SC31. The third electrode E311 is connected to the second electrode E212 to form a node electrode EN. The node electrode EN is disposed on the second insulating film 12 and is covered with the third insulating film 13.

The relay electrode RE is disposed on the third insulating film 13. The relay electrode RE is electrically connected to the node electrode EN through a contact hole CH1 formed on the third insulating film 13. The antenna AT is disposed on the third insulating film 13. That is, the antenna AT and the relay electrode RE are disposed in the same layer. The antenna AT has an opening OP. The relay electrode RE is disposed inside the opening OP.

The antenna AT is formed of a metal such as gold, silver, copper, aluminum, or nickel. The relay electrode RE is formed of a transparent conductive material such as ITO or IZO. However, the antenna AT and the relay electrode RE may be formed of the same material.

The relay electrode RE and the antenna AT are covered with the fourth insulating film 14. That is, the relay electrode RE and the antenna AT are disposed between the third insulating film 13 and the fourth insulating film 14. This may be interpreted that, considering a relationship between the antenna AT and a pair of the insulating films 13 and 14, the third insulating film 13 as a first interlayer insulating film is disposed between the first insulating substrate 10 and the antenna AT, and the fourth insulating film 14 as a second interlayer insulating film is disposed between the pixel electrode PE and the antenna AT.

The pixel electrode PE is disposed on the fourth insulating film 14 and is covered with the first alignment film AL1. The pixel electrode PE contacts the relay electrode RE through a contact hole CH3 passing through the fourth insulating film 14. Note that the pixel electrode PE here corresponds to any of partial electrodes P1 to P3 and the relay electrode RE corresponds to either relay electrode RE1 or relay electrode RE2.

The first insulating film 11 and the second insulating film 12 are formed of an inorganic material such as silicon nitride or silicon oxide. The third insulating film 13 and the fourth insulating film 14 are formed of an organic material such as resin. Note that the pixel circuit CR of FIG. 3, which includes switches SW21 and SW31, is disposed between the first insulating substrate 10 and the fourth insulating film 14.

As can be understood from the above, both the relay electrode RE and the antenna AT are disposed in the same layer in the first substrate SUB1, and the antenna AT can be accommodated without increasing the thickness of the first substrate SUB1.

Figure 5:
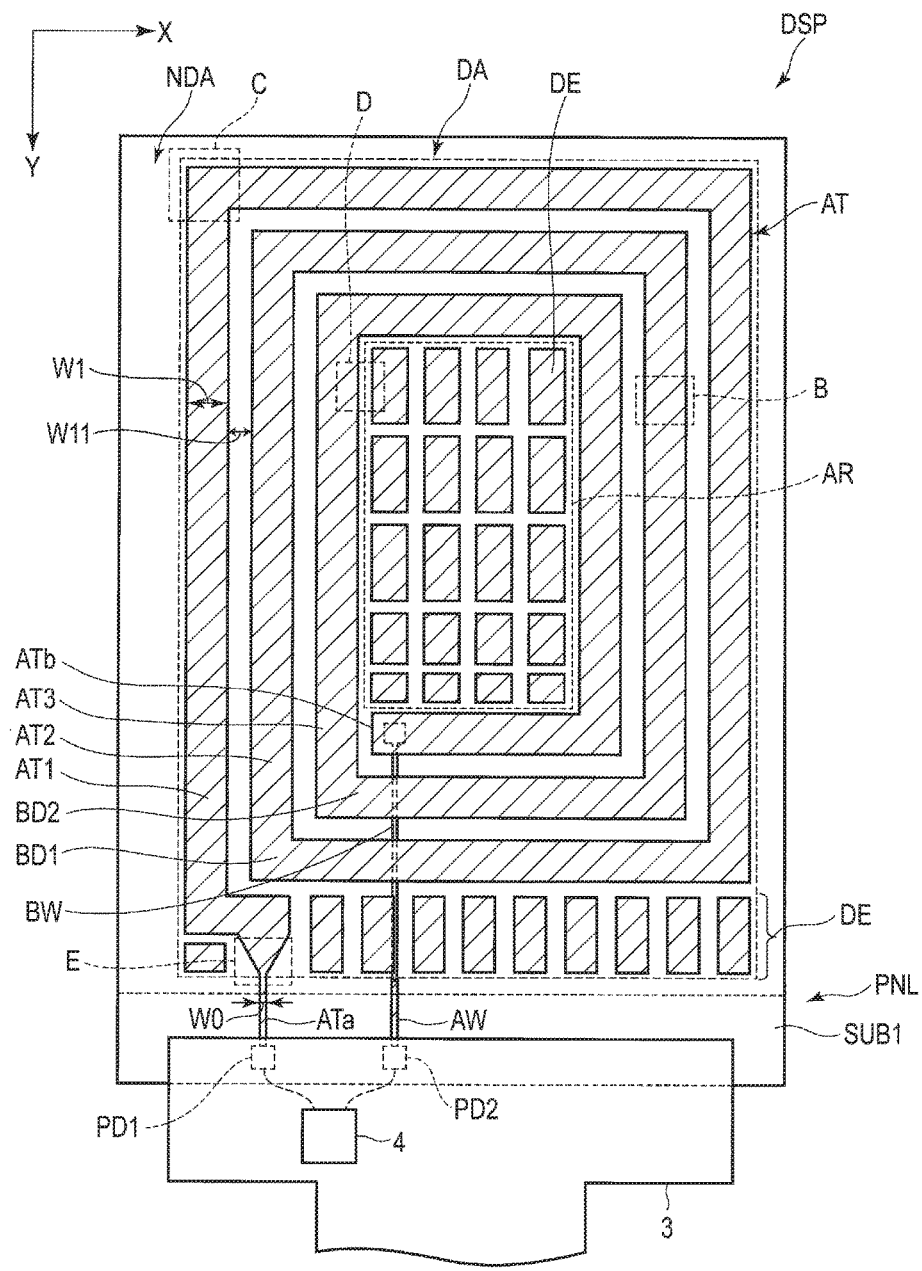
FIG. 5 shows an example of an arrangement of an antenna AT and a dummy electrode DE in the display device DSP.

FIG. 5 shows an example of an arrangement of the antenna AT and a dummy electrode DE in the display device DSP. In the figure, a plan view of an X-Y plane defined by the first direction X and the second direction Y is depicted.

Now, an arrangement of the antenna AT and the dummy electrode DE in a plan view will be explained. The first substrate SUB1 includes the antenna AT formed in a band shape. The antenna AT has one end ATa and the other end ATb. The antenna is formed as a continuous swirl (coil) in the display area DA. The one end ATa of the antenna AT is positioned in the non-display area NDA and the other end ATb is positioned in the display area DA. The one end ATa is electrically connected to a pad PD1. The other end ATb is electrically connected to a pad PD2 through a bridge line BW which is described later. Pads PD1 and PD2 are disposed on the first substrate SUB1 in the non-display area NDA and are connected to a flexible printed circuit 3.

Here, the antenna AT of FIG. 5 is formed as a swirl of approximately three turns on the first substrate SUB1, and in a plan view of the display device DSP, includes a first turn AT1 corresponding to the outermost turn, a second turn AT2 which is within the first turn AT1, and a third turn AT3 which is within the second turn AT2. That is, the first turn AT1 corresponds to the part of the antenna AT from the one end ATa to a bend BD1, the second turn AT2 corresponds to the part of the antenna AT from bend BD1 to a bend BD2, and the third turn AT3 corresponds to the part of the antenna AT from bend BD2 to the other end ATb.

The first to third turns AT1 to AT3 are disposed on the third insulating film 13 of FIG. 4 to be on the same (X-Y) plane. The first to third turns AT1 to AT3 coil to be apart from each other without crossing in a plan view. The first substrate SUB1 has an area AR inside the third turn AT3. Approximately the entirety of the antenna AT is disposed within the display area DA. The antenna AT has a substantially uniform width W1 in the display area DA. On the other hand, the other end ATb of the antenna AT has a width W0 which is less than width W1 in the non-display area NDA.

The first substrate SUB1 includes a dummy electrode DE in the display area DA. The dummy electrode DE is disposed to be apart from the antenna AT. The dummy electrode DE is not connected to any line or circuit within the display panel PNL and is electrically floating. Note that a structure in which the dummy electrode is connected to a GND power source in a different layer may be adopted. The dummy electrode is disposed within the area AR of the first substrate SUB1. Furthermore, in the example depicted, the dummy electrode DE is disposed outside the first turn AT1 in the display area DA.

The first substrate SUB1 includes a bridge line BW. As described later, the bridge line BW is disposed in a layer different from the layer in which the antenna AT is disposed. In this example, the bridge line BW is disposed in the same layer with the signal lines SL shown in FIG. 2. The bridge line BW is electrically connected to the other end ATb of the antenna AT at one end. The bridge line BW is electrically connected to an antenna line AW at the other end. In a plan view, the bridge line BW crosses the first turn AT1 and the second turn AT2 at some parts between the one end and the other end thereof and extends toward the non-display area NDA. The antenna line AW is disposed in the non-display area NDA and is electrically connected to pad PD2.

A driver IC chip 4 for driving the antenna AT is disposed on the flexible printed circuit 3. The driver IC chip 4 is electrically connected to pads PD1 and PD2. Note that the driver IC chip 4 for driving the antenna AT may be disposed on a substrate other than the flexible printed circuit 3. Note that the driver IC chip 4 may be omitted and a driver circuit for driving the antenna AT may be installed in other driver IC chip which is not shown.

Note that the structure of the antenna AT is not limited to the example depicted. For example, various shapes such as a circle, rectangle, and polygon may be adopted for the antenna AT. Furthermore, in the example depicted, the antenna AT is a swirl of approximately three turns; however, the number of turns is not limited to three. The turn may be made only once or may be made four times or more. Furthermore, the dummy electrode may be omitted.

Figure 6:
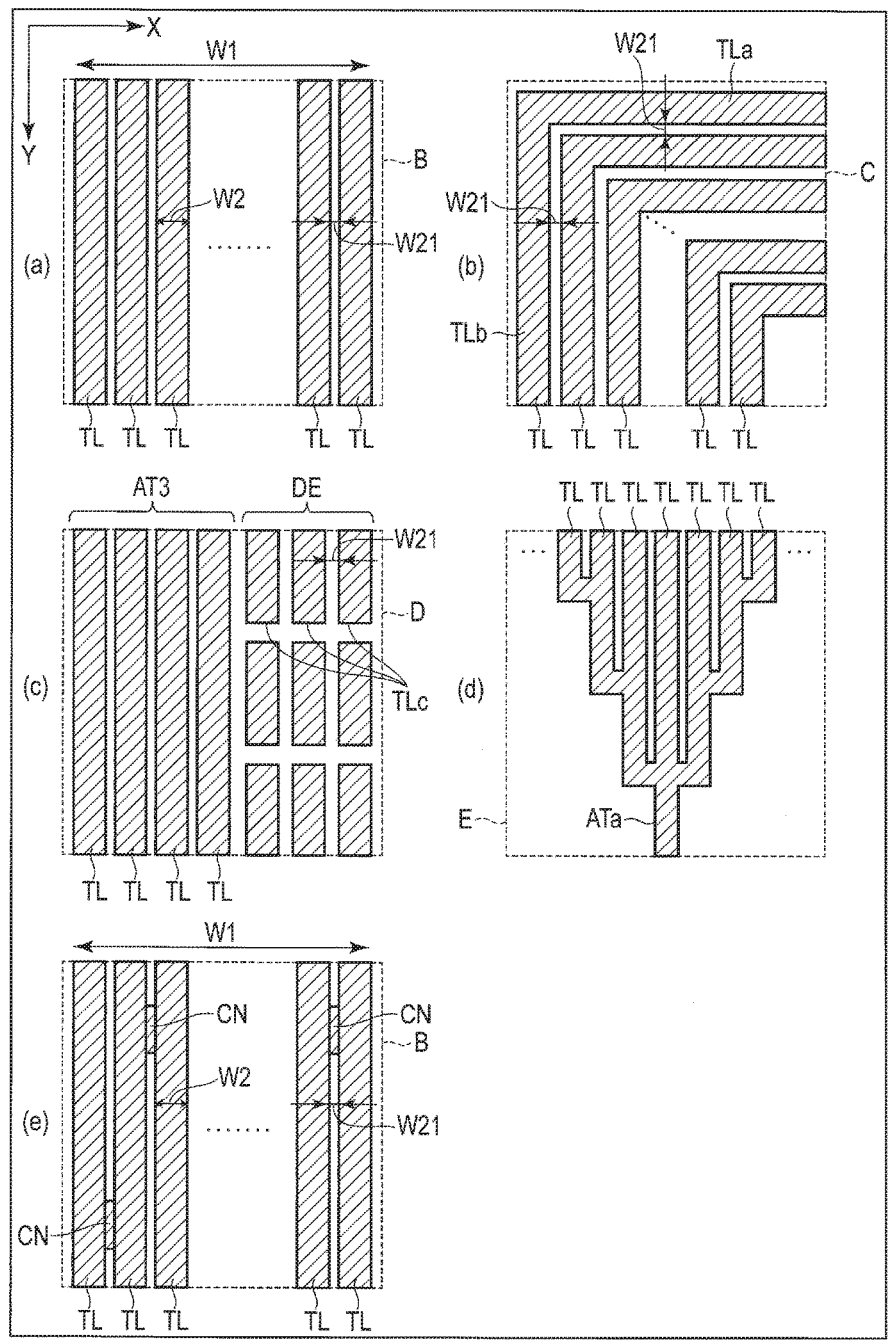
FIG. 6 shows areas B, C, D, and E of the antenna AT of FIG. 5 in detail.

FIG. 6 shows in detail areas B, C, D, and E of the antenna AT shown in FIG. 5. FIG. 6(a) shows area B of the antenna AT. In the example depicted, the second turn AT2 of the antenna AT includes a plurality of thin lines TL. Similarly, the first turn AT1 and the third turn AT3 include a plurality of thin lines TL. The thin lines TL extend along the second direction Y. As mentioned above, the antenna has a width W1 which is approximately 2 mm. A thin line TL has a width W2 which corresponds to the width of a unit pixel or two unit pixels. In this example, the width W2 of the thin line TL is approximately 140 to approximately 280 μm. Note that a gap W21 between adjacent thin lines TL should be equal to a gap W11 between the first to third turns shown in FIG. 5. In such a structure of the antenna AT composed of a plurality of thin lines TL, the antenna AT can be provided in the display area DA with a certain density by reducing a difference between the gap W21 between adjacent thin lines TL and the gap W11 between the first to third turns AT1 to AT3, and thus, a step in the display area DA caused by the antenna AT can be reduced. Consequently, the surface of the reflective electrode can be formed smoothly and a step between adjacent reflective electrodes can be prevented accordingly, and thus, reflection luminosity in the entirety of the display area DA can be improved.

FIG. 6(e) shows a variation of area B of the antenna AT, and therein, a connector CN is disposed between adjacent thin lines TL in addition to the structure shown in FIG. 6(a). That is, adjacent thin lines TL may be connected together by connectors CN.

FIG. 6(b) shows area C of the first turn AT1 of the antenna AT. In the example depicted, thin lines TL extends in the first direction X and then turns in the second direction Y, and thin lines TLa extending along the first direction X and thin lines TLb extending along the second direction Y are depicted. In FIG. 6(b), the gap W21 between adjacent thin lines TLa and adjacent thin lines TLb should also be equal to the gap W11 between the first to third turns AT1 to AT3 in FIG. 5.

FIG. 6(c) shows area D in which the third turn AT3 of the antenna AT and the dummy electrode DE are disposed. In the example depicted, the dummy electrode DE is composed of a plurality of thin lines TLc as the antenna AT is. In that case, the thin line TLc of the dummy electrode DE should have a width W2 which is approximately the same as the thin line TL of the antenna AT. Note that, in FIG. 6(c), the gap W21 between adjacent thin lines TLc should also be equal to the gap W11 between the first to third turns AT1 to AT3 in FIG. 5.

FIG. 6(d) shows area E which is close to the one end ATa of the antenna AT. In the example depicted, one of the thin lines TL which is in the center of area E extends toward the one end ATa. The other thin lines TL in area E converge into the one end ATa as outer thin lines are connected to their adjacent inner thin lines halfway. In such a manner, each turn of the antenna AT has approximately the same width W1 in the display area DA while the one end ATa is thinned in the non-display area NDA.

Figure 7:
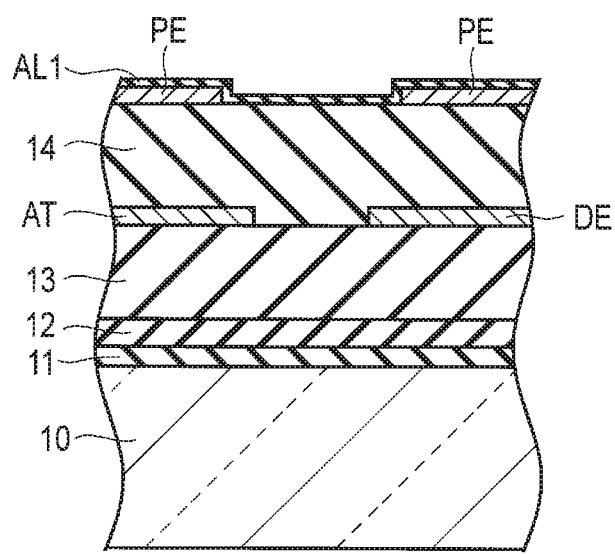
FIG. 7 is another cross-section of the first substrate SUB1 of the display panel PNL of FIG. 1.

FIG. 7 is another cross-section of the first substrate SUB1 of the display panel PNL of FIG. 1.

The dummy electrode DE is disposed on the third insulating film 13. That is, the dummy electrode DE and the antenna AT are in the same layer. The dummy electrode DE is, for example, formed of the material used in and through the manufacturing process used for the antenna AT. The antenna AT and the dummy electrode DE have the same thickness. With the dummy electrode DE disposed as above, the layer in which the antenna AT id disposed can be formed with less steps, and thus, the reflectivity can be uniformed in the entirety of the display panel PNL and unevenness in display quality can be prevented.

Figure 8A:
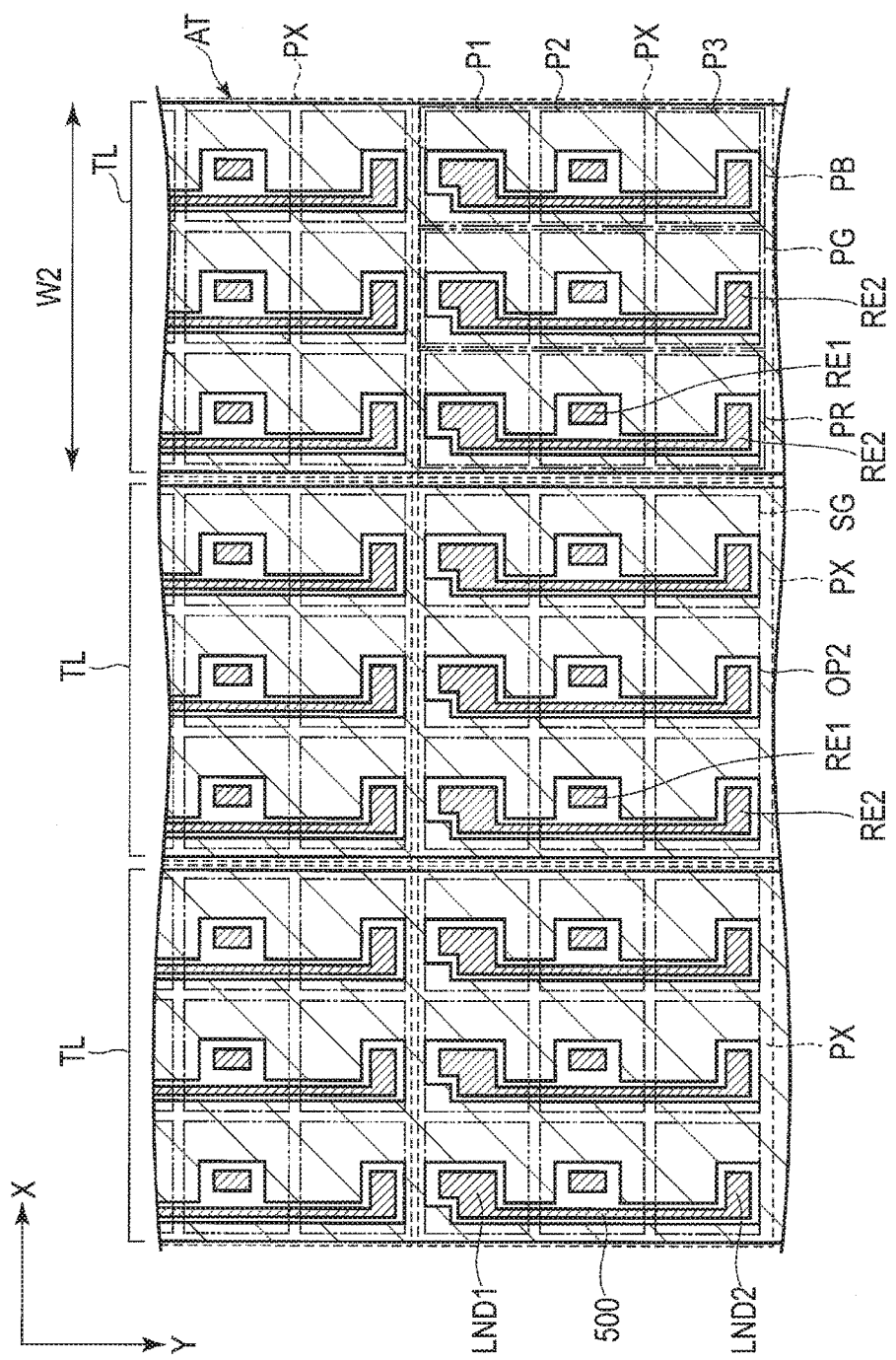
FIG. 8A shows a positional relationship between the antenna AT and relay electrodes RE.

FIG. 8A shows a positional relationship between the antenna AT and the relay electrodes RE. In the example of FIG. 8A, a unit pixel PX includes three subpixels PR, PG, and PB, and each of subpixels PR, PG, and PB includes three partial electrodes P1 to P3. Each unit pixel PX is depicted in a doted line, each of subpixels PR, PG, and PB is depicted in a single-dashed line, and each of partial electrodes P1 to P3 is depicted in a double-dashed line.

In the example depicted, a unit pixel PX is formed in substantially a square and the unit pixel PX has a length in the first direction X and a length in the second direction Y which are equal or substantially equal. For example, a side of the unit pixel PX is 100 to 200 μm (in this example, approximately 140 μm).

In each of subpixels PR, PG, and PB, a relay electrode RE1 and a relay electrode RE2 are disposed. Relay electrode RE1 is connected to partial electrode P2. Relay electrode RE2 is connected to partial electrodes P1 and P3. Relay electrode RE1 is a quadrangle and overlaps partial electrode P2 in a plan view, and partial electrode P2 contacts relay electrode RE1 through the fourth insulating film 14.

In the example of FIG. 8A, relay electrode RE2 includes a wide land LND1 opposed to partial electrode P1, wide land LND2 opposed to partial electrode P3, and an interconnection 500 between the pair of lands LND1 and LND2. The interconnection 500 passes a side of relay electrode RE1 with a gap therebetween.

In the example depicted, a thin line TL of the antenna AT has a width W2 which correspond to that of a unit pixel PX. The thin line TL includes openings OP2 which overlap partial electrodes P1 to P3. Relay electrodes RE1 and RE2 are disposed inside opening OP2 of the thin line TL. In other words, the antenna AT is positioned in the proximity of relay electrodes RE1 and RE2.

Figure 8B:
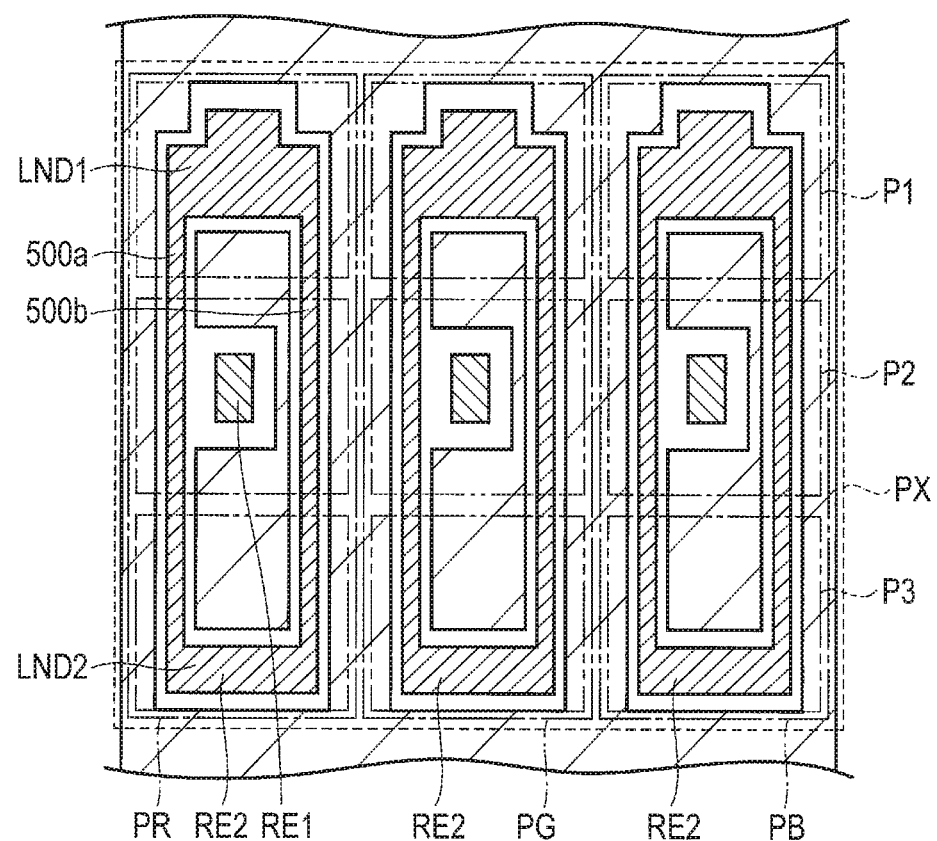
FIG. 8B shows another positional relationship between the antenna AT and relay electrodes RE.

FIG. 8B shows another positional relationship between the antenna AT and the relay electrode RE. As compared to the example of FIG. 8A, the shape of relay electrode RE2 is different in the structure of FIG. 8B. In this example, relay electrode RE2 is formed as a loop surrounding relay electrode RE1. Relay electrode RE2 includes lands LND1 and LND2 and interconnections 500a and 500b which connect lands LND1 and LND2. Interconnection 500a is disposed in the left of relay electrode RE1 and interconnection 500b is disposed in the right of relay electrode RE1.

Note that, as in the example of FIG. 8A, if relay electrode RE2 is disposed to only pass a side relay electrode RE1, the area of the antenna AT can be increased as compared to the case where relay electrode RE2 is formed as a loop.

FIG. 9 is a cross-section of the display device DSP of FIG. 5, taken along the bridge line BW. In the example depicted, the bridge line BW is disposed between the second insulating film 12 and the third insulating film 13 and is formed in the layer in which the signal lines SL of FIG. 1 are formed. The bridge line BW may be formed of the material used in the signal lines SL or may be formed of a different material. Note that, the bridge line BW may be formed in other conductive layer as long as it does not share the layer with the antenna AT, and specifically, the bridge line BW may be formed in the layer in which the scan lines CL are formed, for example.

The first to third turns AT1 to AT3 of the antenna AT cross the bridge line BW through the third insulating film 13. The other end ATb of the antenna AT is electrically connected to one end BWa of the bridge line BW through a contact hole CH5 formed in the third insulating film 13.

The antenna line AW is disposed on the third insulating film 13. The antenna line AW is electrically connected to the other end BWb of the bridge line BW through a contact hole CH7 formed in the third insulating film 13, and is electrically connected to pad PD2. In the example depicted, pad PD2 is disposed on the fourth insulating film 14; however, it may be formed integrally with the antenna line AW on the third insulating film 13. A connection line CW of the flexible printed circuit 3 is electrically connected to pad PD2 through a conductive material FC such as an anisotropic conductive film.

In the present embodiment, the antenna AT is disposed in the display area DA of the MIP display panel PNL of. Furthermore, the antenna AT is disposed in the layer between the third insulating film 13 and the fourth insulating film 14 in which the relay electrodes RE are disposed. Therefore, the antenna AT can be installed in the display panel PNL using a space around the relay electrodes RE effectively while reducing an increase in thickness of the display panel PNL and a restriction of design of the display device DSP.

Since the antenna AT and the relay electrodes RE are disposed in the same layer, the thickness of the layer between the third insulating film 13 and the fourth insulating film 14 is flattened, and thus, the pixel electrodes PE can be smoothly formed on the fourth insulating film 14. Consequently, a decrease in the display quality can be suppressed.

Furthermore, with the bridge line BW, electric conductance between the antenna AT and the flexible printed circuit 3 can be achieved while turns AT1 to AT3 of the antenna AT are kept apart. Therefore, an electric failure caused by a contact in turns AT1 to AT3 can be prevented.

FIG. 10 shows another example of the arrangement of the antenna AT of the display device DSP and the dummy electrode DE. As compared to the example of FIG. 5, the first to third turns AT1 to AT3 are thinned and pulled in the non-display area NDA in the example of FIG. 9.

In this example, one end ATa of the antenna AT is electrically connected to a pad PD1. The other end ATb of the antenna AT is a thinned part of a third turn AT3 pulled in the non-display area NDA. The bridge BW is entirely disposed in the non-display area NDA and is electrically connected to the other end ATb of the antenna AT at one end and to an antenna line AW at the other end. The bridge line BW crosses the thinned first to third turns AT1 to AT3 between its one end and other end in a plan view. The bridge line BW is electrically connected to a pad PD2 through the antenna line AW.

FIG. 11 shows an area E of the antenna AT of FIG. 10 in detail. In the example depicted, thinned first to third turns AT1 to AT3 extend in the first direction X to be pulled in the non-display area NDA from the display area DA, bend in the second direction Y in the non-display area NDA, and bend again in the first direction X toward the display area DA exiting the non-display area NDA. The other end ATb of the antenna AT is pulled in the non-display area NDA from the display area DA. Therefore, the bridge line BW can be disposed in the non-display area NDA as shown in FIG. 10. The bridge line BW must be electrically insulated from, for example, scan lines CL and signal lines SL in the display area DA. If the bridge line BW is disposed in the display area DA where various lines are gathered, the route of the bridge line BW may be restricted. On the other hand, lines which cross each other are not so much gathered in the non-display area NDA, and thus, the bridge line BW in the non-display area NDA is not excessively restricted as shown and the route of the bridge line BW can be made in a relatively short path. Furthermore, if the bridge line BW is disposed in the non-display area NDA, a step caused by the bridge line BW can be prevented.

FIG. 12A is a schematic cross-section showing a variation of the display device DSP of the present embodiment. The display device of the example of FIG. 12A is an organic electroluminescence (EL) display device using an organic luminescent layer as its display function layer.

A switching element SW includes a semiconductor layer SC disposed between the first insulating substrate 10 and the first insulating film 11, gate electrode GE disposed between the first insulating film 11 and the second insulating film 12, and first electrode E11 and second electrode E12 disposed between the second insulating film 12 and the third insulating film 13.

The antenna AT is disposed between the third insulating film 13 and the fourth insulating film 14. Note that the arrangement of the antenna AT in the display area DA may be that of either FIG. 5 or FIG. 10. Furthermore, as explained with reference to FIG. 9, the bridge line BW which is not shown here is disposed in a layer in which the antenna AT is not disposed.

An organic EL device OLED is disposed on the fourth insulating film 14. The organic EL device OLED includes a pixel electrode PE, organic luminescent layer ORG, and common electrode CE. The organic luminescent layer ORG corresponds to a display function layer. In this embodiment, the pixel electrode PE functions as an anode and the common electrode CE functions as a cathode.

The pixel electrode PE is disposed on the fourth insulating film 14 and contacts a second electrode E12. The pixel electrode PE functions as a reflective electrode which reflects light emitted from the organic luminescent layer ORG toward the display surface. Or, the pixel electrode PE may be formed of ITO and a reflective electrode formed of a metal material may be disposed separately below the pixel electrode PE, for example.

The organic luminescent layer ORG is structured to emit white light by mixing a plurality of luminescent materials. Furthermore, the organic luminescent layer ORG may include a functional layer such as a hole transport layer, hole injection layer, electron transport layer, or electron injection layer. The organic EL device OLED as above corresponds to a top emission type device which emits light toward a cover member 30.

A bank 15 defines each organic EL device PLED. A barrier film 16 prevents elements such as moisture from entering the organic EL device OLED and is formed of a transparent material.

The cover member 30 is formed of transparent glass or resin. On the surface of the cover member 30 opposed to the organic EL device OLED, a light shielding layer 31 and a color filter 32 are disposed, for example. Between the barrier film 16 and the light shielding layer 31 and color filter 32, a transparent filler 40 is charged.

Figure 12B:
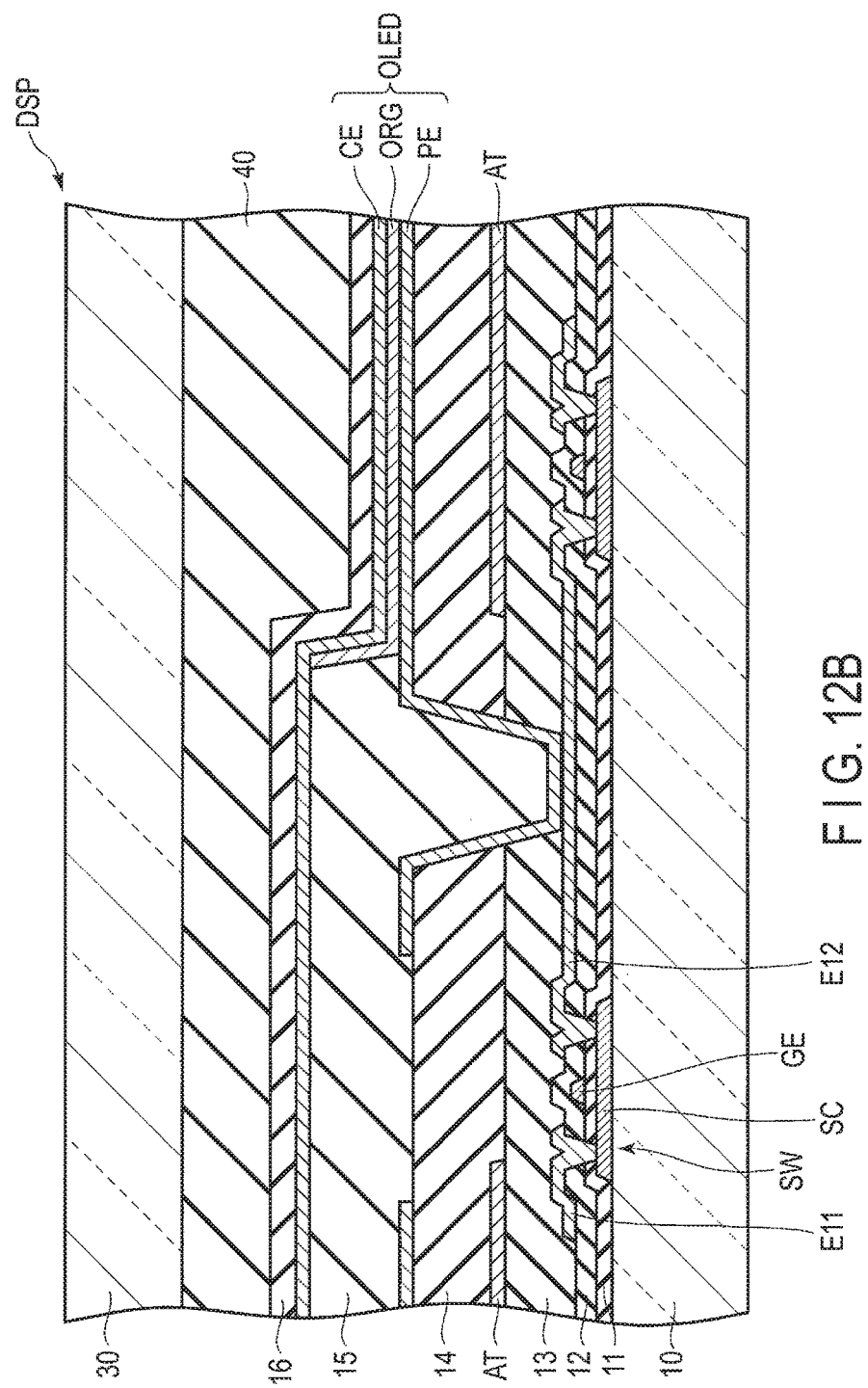
FIG. 12B is a schematic cross-section showing another variation of the display device DSP of the embodiment.

FIG. 12B is a schematic cross-section showing another variation of the display device DSP of the embodiment. As compared to the example of FIG. 12A, the display device DSP of FIG. 12B includes an organic EL device OLED which emits only one-color such as red, green, or blue. That is, the organic luminescent layer ORG is formed of a luminescent material which emits one-color of red, green, or blue. Furthermore, in the example depicted, a light shielding layer 31 and color filter 32 are not disposed on the surface of a cover member 30 which is opposed to the organic EL device OLED.

In such a display device DSP, the organic EL device OLED is of top emission type, and thus, a space used for the arrangement of the antenna AT can be secured between the first insulating substrate 10 and the organic EL device OLED. Therefore, the antenna AT can be stored in the display device DSP without causing an increase in the thickness of the display device DSP.

FIG. 13 shows an electronic device 100 in which the display device DSP of the above embodiment is applied. Note that driver IC chips 200 and 400, flexible printed circuit 300, and display panel PNL1 of FIG. 13 correspond to driver IC chips 2 and 4, flexible printed circuit 3, and display panel PNL of FIG. 6, respectively, and they function substantially the same. Furthermore, a mount MT is formed along a short side of the display area MT in the example of FIG. 6 while a mount MT is formed along a long side of the display area DA in the example of FIG. 11. Such an electronic device 100 may be used in a card or shelf display the contents of which is rewritable using a close-range wireless communication function.

As can be understood from the above, the present embodiment can present a high performance display device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
   an insulating substrate;
   a display function layer disposed above the insulating substrate;
   a reflective electrode disposed between the insulating substrate and the display function layer, the reflective electrode to which a potential for image display is applied;
   an antenna having a band shape disposed between the insulating substrate and the reflective electrode;
   a pixel circuit disposed between the insulating substrate and the reflective electrode;
   a relay electrode which relays the pixel circuit and the reflective electrode;
   a first interlayer insulating film disposed between the insulating substrate and the relay electrode; and
   a second interlayer insulating film disposed between the relay electrode and the reflective electrode, wherein
   the antenna is disposed in the same layer in which the relay electrode is disposed while keeping apart from the relay electrode.

2. The display device of claim 1, wherein the antenna is formed as a swirl with a gap therein in a plan view.

3. The display device of claim 2, comprising a display area for image display and a non-display area around the display area, wherein the antenna is disposed to be opposed to at least the display area.

4. The display device of claim 3, further comprising a bridge line disposed in a layer which is different from that of the antenna, wherein
   the antenna includes an end disposed within the non-display area and the other end disposed within the display area, and the bridge line is electrically connected to the other end, crosses the antenna in a plan view, and extends toward the non-display area.

5. The display device of claim 4, wherein the one end has a width which is less than that of the antenna in the display area.

6. The display device of claim 4, wherein the other end is electrically connected to an antenna line disposed in the non-display area through the bridge line.

7. The display device of claim 1, wherein the display function layer is a liquid crystal layer.

8. The display device of claim 1, wherein the antenna is formed of a plurality of thin lines.

9. The display device of claim 1, wherein the antenna includes an opening in a position opposed to the reflective electrode, and the relay electrode is disposed within the opening to be apart from the antenna.

10. The display device of claim 1, further comprising a dummy electrode disposed in the same layer in which the antenna is disposed, the dummy electrode disposed to be apart from the antenna and having the same thickness as that of the antenna.

11. The display device of claim 1, wherein the display function layer is an organic luminescent layer.

12. The display device of claim 11, comprising a switching element disposed on the insulating substrate, and a first interlayer insulating film and a second interlayer insulating film disposed between the insulating substrate and the reflective electrode, wherein
the antenna is disposed between the first interlayer insulating film and the second interlayer insulating film.

13. A display device comprising:
an insulating substrate;
a display function layer disposed above the insulating substrate;
a reflective electrode disposed between the insulating substrate and the display function layer, the reflective electrode to which a potential for image display is applied;
an antenna having a band shape disposed between the insulating substrate and the reflective electrode;
a switching element disposed on the insulating substrate, and
a first interlayer insulating film and a second interlayer insulating film disposed between the insulating substrate and the reflective electrode, wherein
the antenna is disposed between the first interlayer insulating film and the second interlayer insulating film, and
the display function layer is an organic luminescent layer.

14. The display device of claim 13, wherein the antenna is formed as a swirl with a gap therein in a plan view.

15. The display device of claim 14, comprising a display area for image display and a non-display area around the display area, wherein the antenna is disposed to be opposed to at least the display area.

16. The display device of claim 15, further comprising a bridge line disposed in a layer which is different from that of the antenna, wherein
the antenna includes an end disposed within the non-display area and the other end disposed within the display area, and the bridge line is electrically connected to the other end, crosses the antenna in a plan view, and extends toward the non-display area.

17. The display device of claim 16, wherein the one end has a width which is less than that of the antenna in the display area.

18. The display device of claim 16, wherein the other end is electrically connected to an antenna line disposed in the non-display area through the bridge line.

19. The display device of claim 13, wherein the antenna is formed of a plurality of thin lines.

20. The display device of claim 13, comprising a pixel circuit disposed between the insulating substrate and the reflective electrode, a relay electrode which relays the pixel circuit and the reflective electrode, the first interlayer insulating film disposed between the insulating substrate and the relay electrode, and the second interlayer insulating film disposed between the relay electrode and the reflective electrode, wherein
the antenna is disposed in the same layer in which the relay electrode is disposed while keeping apart from the relay electrode.

* * * * *